United States Patent
Strobel et al.

(10) Patent No.: US 12,028,194 B2
(45) Date of Patent: Jul. 2, 2024

(54) RECEIVER AND RECEIVE METHOD FOR A PASSIVE OPTICAL NETWORK

(71) Applicant: Intel Corporation, Santa Clara, CA (US)

(72) Inventors: Rainer Strobel, Munich (DE); Ravindra Singh, Bangalore (IN)

(73) Assignee: Intel Corporation

( * ) Notice: Subject to any disclaimer, the term of this patent is extended or adjusted under 35 U.S.C. 154(b) by 150 days.

(21) Appl. No.: 17/753,089

(22) PCT Filed: Sep. 28, 2020

(86) PCT No.: PCT/US2020/052994
§ 371 (c)(1),
(2) Date: Feb. 18, 2022

(87) PCT Pub. No.: WO2021/080740
PCT Pub. Date: Apr. 29, 2021

(65) Prior Publication Data
US 2022/0286332 A1  Sep. 8, 2022

(30) Foreign Application Priority Data
Oct. 25, 2019 (IN) .............................. 201941043527

(51) Int. Cl.
*H04L 25/06* (2006.01)
*H03M 13/11* (2006.01)
(Continued)

(52) U.S. Cl.
CPC ....... *H04L 25/067* (2013.01); *H03M 13/1125* (2013.01); *H03M 13/4146* (2013.01); *H04L 25/03038* (2013.01); *H04L 25/03286* (2013.01)

(58) Field of Classification Search
CPC ............. H04L 25/067; H04L 25/03038; H04L 25/03286; H04L 1/0047; H04L 25/03254;
(Continued)

(56) References Cited

U.S. PATENT DOCUMENTS

2017/0026145 A1  1/2017 Soto et al.
2018/0167143 A1  6/2018 Yao et al.
(Continued)

FOREIGN PATENT DOCUMENTS

KR  10-2009-0132523 A  12/2009

*Primary Examiner* — Fitwi Y Hailegiorgis
(74) *Attorney, Agent, or Firm* — 2SPL Patent Attorneys PartG mbB; Kieran O'Leary

(57) ABSTRACT

A receiver for a passive optical network is provided. The receiver includes an analog-to-digital converter circuitry configured generate a digital receive signal based on an analog receive signal. The analog receive signal is based on an optical receive signal encoded with a binary transmit sequence. The receiver additionally comprises linear equalizer circuitry configured to generate an equalized receive signal by linearly equalizing the digital receive signal. Further, the receiver comprises secondary equalizer circuitry configured to generate soft information indicating a respective reliability of elements in the equalized receive signal using the Viterbi algorithm. In addition, the receiver comprises decoder circuitry configured to generate a digital output signal based on the soft information using soft decision forward error correction.

25 Claims, 7 Drawing Sheets

(51) Int. Cl.
*H03M 13/41* (2006.01)
*H04L 25/03* (2006.01)

(58) Field of Classification Search
CPC . H04L 1/005; H04L 25/03178; H04L 1/0054; H03M 13/1125; H03M 13/4146; H03M 13/1102; H03M 13/2957; H03M 13/6331; H04Q 2213/1301; H04Q 11/0071; H04B 10/60
USPC ............................................. 375/341
See application file for complete search history.

(56) References Cited

U.S. PATENT DOCUMENTS

| | | |
|---|---|---|
| 2018/0234185 A1 | 8/2018 | Ferreira et al. |
| 2019/0074905 A1 | 3/2019 | Liu et al. |
| 2020/0136793 A1* | 4/2020 | Strobel .................. H04B 10/27 |

* cited by examiner

RECEIVER AND RECEIVE METHOD FOR A PASSIVE OPTICAL NETWORK

FIELD

The present disclosure relates to receive technology for a Passive Optical Network (PON). In particular, examples relate to a receiver and a receive method for a PON.

BACKGROUND

Data rates in PONs are increasing per wavelength. Low-Density Parity-Check (LDPC) codes, which can process soft information (i.e. a non-binary input), are introduced in PONs for improved error correction (such as Forward Error Correction, FEC) and, hence, increased efficiency. Furthermore, digital equalization is of increasing importance at higher transmission speeds. As the PON transmission channel is highly non-linear, especially due to low cost optical receiver components, there is a demand for non-linear equalization.

Hence, there may be a desire for soft information reception technology for PONs.

BRIEF DESCRIPTION OF THE FIGURES

Some examples of apparatuses and/or methods will be described in the following by way of example only, and with reference to the accompanying figures, in which.

DETAILED DESCRIPTION

Figure 1:
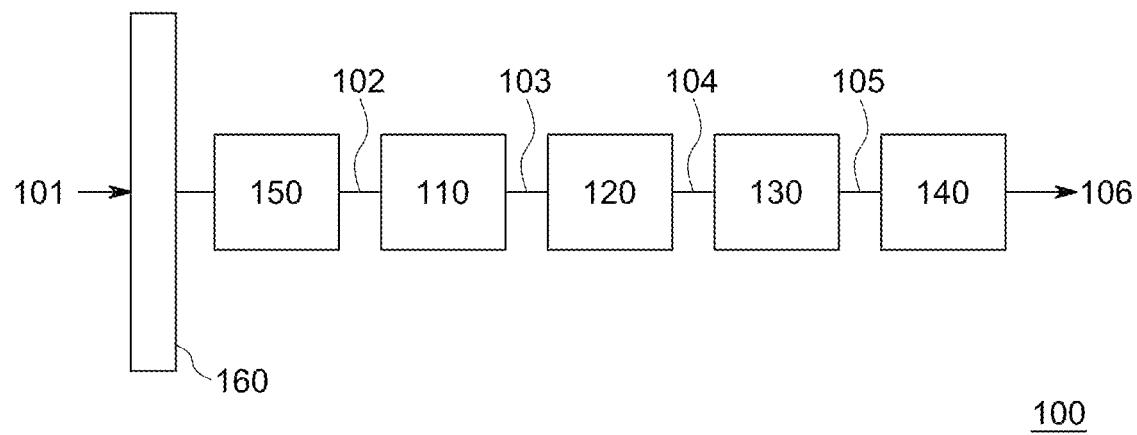
FIG. 1 illustrates a first example of a receiver for a PON.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an 'or', this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

FIG. 1 illustrates a receiver 100 for a PON. The PON is not illustrated in FIG. 1. The PON is a fiber-optic access network and couples a transmitter side (e.g. an Optical Line Terminal, OLT, of a service provider) with the receiver 100 and optionally further receivers. The PON consists of fiber and passive splitters. The PON does not comprise any active elements in between end points of the network (i.e. the optical transmission has no power requirements or active electronic parts once the signal is going through the network).

The receiver 100 comprises an (hardware) interface 160 for coupling to the PON. For example, interface 160 may couple to an Optical Network Terminal (ONT) or an Optical Network Unit (ONU) of the PON. The interface 160 is configured to receive an optical signal 101 from the PON. For example, at a transmitter side for downstream data, Externally Modulated Lasers (EMLs) may be used to create an intensity modulated signal, e.g., with 2 levels (Non-Return-to-Zero, NRZ, modulation), which is received at the receiver 100 via the PON. The optical receive signal 101 is encoded with a binary transmit sequence that is to be transmitted from the transmitter side to the receiver 100.

The receiver further comprises optical-to-electrical converter circuitry 150 configured to convert the optical signal 101 to an electrical analog receive signal 102. For example, the optical-to-electrical converter circuitry 150 may comprise one or more photo diodes such as Avalanche Photo Diodes (APDs) for converting the optical signal 101 into an electrical signal. Further, the optical-to-electrical converter circuitry 150 may comprise one or more amplifiers such as Trans-Impedance Amplifiers (TIAs) for adjusting a gain of the electrical signal in order to obtain the analog receive signal 102.

In addition, the receiver comprises Analog-to-Digital Converter (ADC) circuitry 110 configured generate a digital receive signal 103 based on the analog receive signal 102. Any ADC technique may be used by the ADC circuitry 110 for converting the analog receive signal 102 to the digital receive signal 103.

The receiver 100 further comprises linear equalizer circuitry 120 configured to generate an equalized receive signal 104 by linearly equalizing the digital receive signal 103. For example, the linear equalizer circuitry 120 may comprise a Feed-Forward Equalizer (FFE) for linearly equalizing the digital receive signal 103. However, also any other linear equalization technique may be used. Additionally, the receiver 100 comprises secondary equalizer circuitry 130 configured to generate soft information 105 indicating a respective reliability of elements in the equalized receive signal 104. The elements in the equalized receive signal 104 may, e.g., be pulses, data bits or data symbols. The secondary equalizer circuitry 130 uses the Viterbi algorithm for determining the soft information 105 based on the equalized receive signal 104. The linear equalizer circuitry 120 and the secondary equalizer circuitry 130 are coupled in series between the ADC circuitry 110 and the decoder circuitry 140.

In general, the term "soft information" denotes information about a respective reliability of elements in a signal or (data) sequence. In other words, soft information is reliability information indicating the reliability that a value represented by a certain element in a signal or sequence is correct.

The decoder circuitry 140 is configured to generate a digital output signal 106 based on the soft information 105. The decoder circuitry 140 uses soft decision FEC for determining the digital output signal 106 based on the input soft information 105. For example, the decoder circuitry 140 may comprise a soft decision LDPC decoder using soft decision LDPC decoding for determining the digital output signal 106 based on the soft information 105. The decoder circuitry 140 determines a receive sequence based on the soft information 105 using soft decision FEC. The digital output signal 106 represents further soft information indicating the respective reliability of the elements in the receive sequence determined by the decoder circuitry 140. For example, the further soft information may be Log Likelihood Ratios (LLRs) indicating the respective reliability of the elements in the receive sequence. However, it is to be noted that the decoder circuitry 140 may alternatively determine any other type of soft information indicating the respective reliability of the elements in the receive sequence (e.g. Euclidean distances). That is, the decoder circuitry 140 may be soft input soft output decoder circuitry.

As described above, the PON transmission channel is highly non-linear. The receiver 100 is a soft information receiver, which is based on the Viterbi algorithm and may, hence, allow non-linear equalization. In particular, the receiver 100 may allow digital equalization for the non-linear PON channel to provide soft information for effective FEC decoding, even with a low resolution of the ADC circuitry 110. Accordingly, the receiver 100 may enable a high performance on the non-linear PON transmission channel as well as low requirements on the resolution of the ADC circuitry 110 and the linearity of the linear equalizer circuitry 120. Further, error propagation may be avoided in the proposed receiver architecture.

Figure 2:
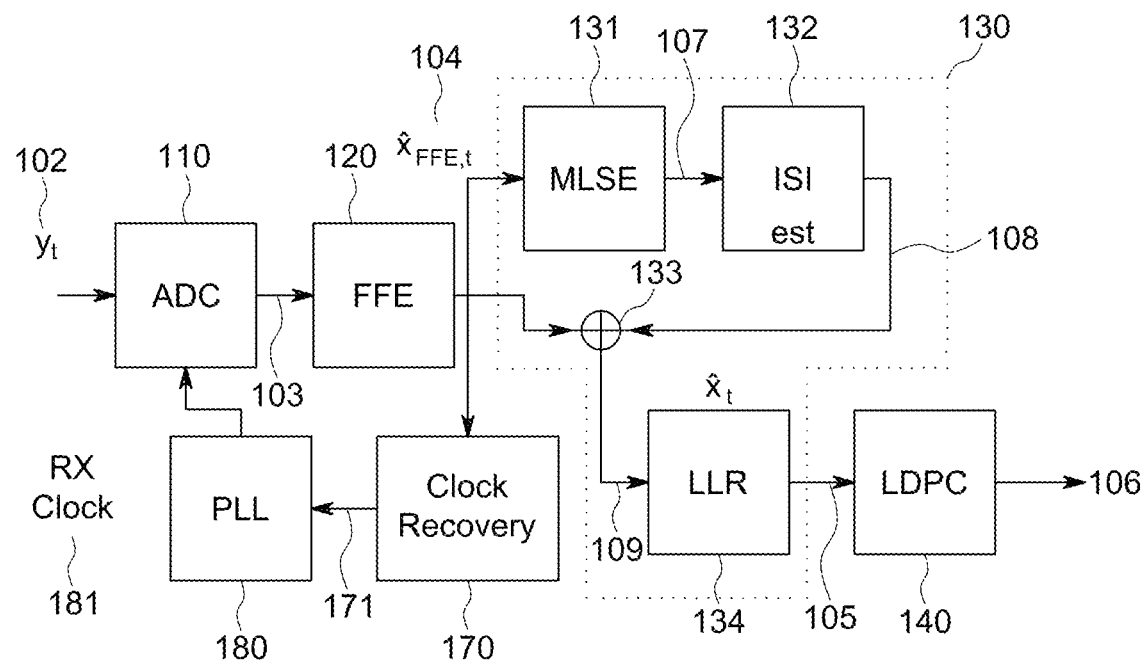
FIG. 2 illustrates a second example of a receiver for a PON.
Figure 3:
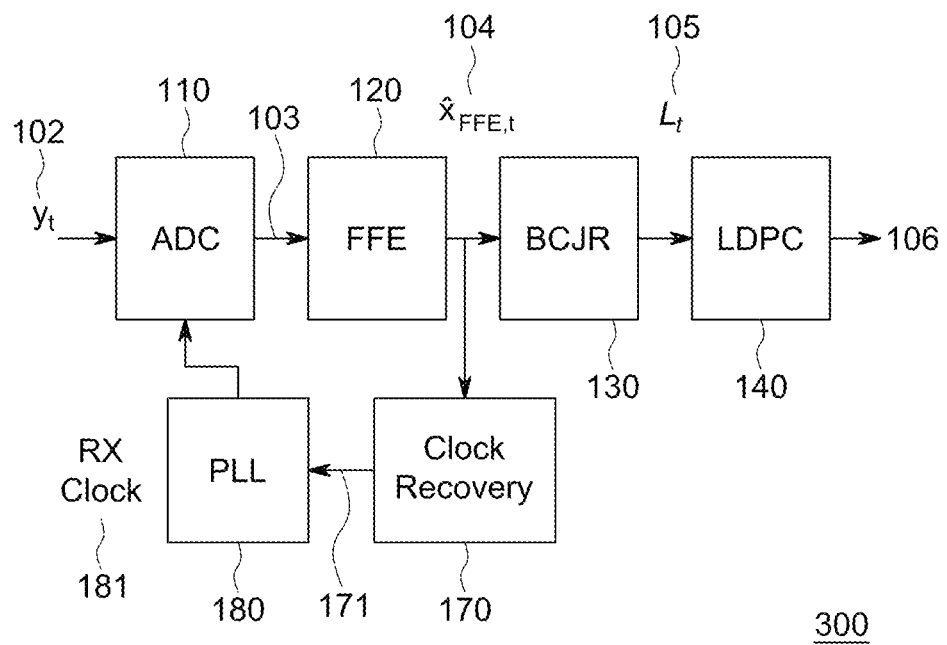
FIG. 3 illustrates a third example of a receiver for a PON.
Figure 4:
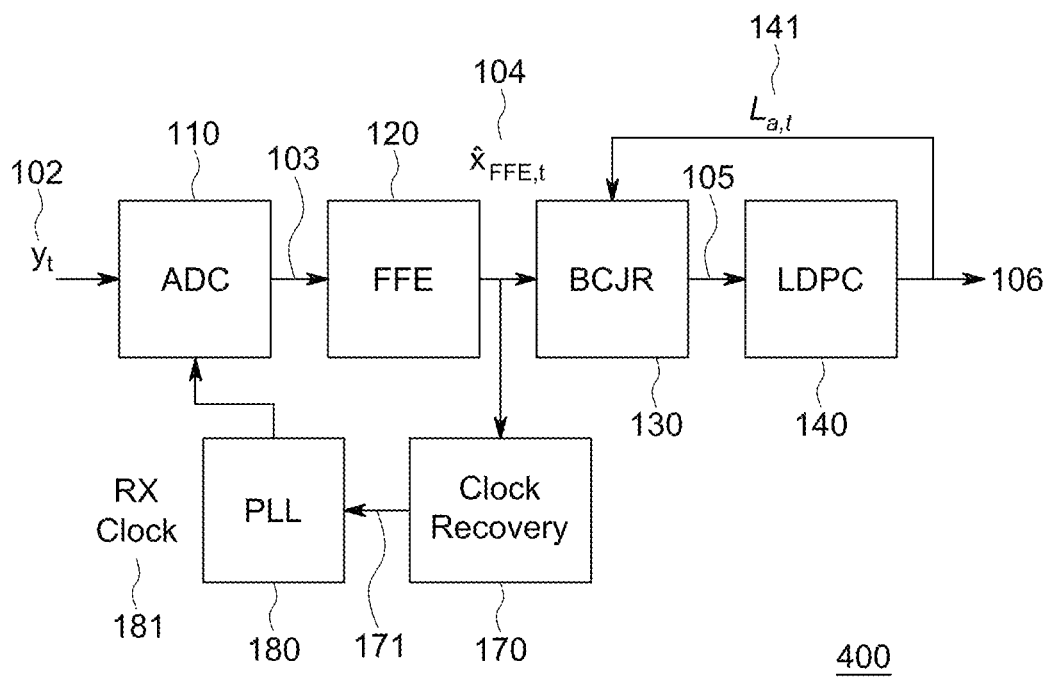
FIG. 4 illustrates a fourth example of a receiver for a PON.

In the following, exemplary implementations of the Viterbi-based secondary equalizer circuitry 130 will be described with respect to FIGS. 2 to 4. In the examples of FIGS. 2 to 4, the interface to the PON and the optical-to-electrical converter circuitry is omitted for reasons of simplicity.

FIG. 2 illustrates an example of a receiver 200. Similar to what is described above for the receiver 100, the receiver 200 comprises low resolution ADC circuitry 110 which is followed by linear equalizer circuitry 110. The linear equalizer circuitry 110 is implemented as a linear FFE in the example of FIG. 2.

In addition to what is described above for the receiver 100, the receiver 200 additionally comprises circuitry for recovering the sampling clock for the ADC circuitry 110. It is to be noted that also the receiver 100 may additionally comprise circuitry for recovering the sampling clock for the ADC circuitry 110. In particular, the receiver 200 comprises clock recovery circuitry 170 configured to determine, based on the equalized receive signal 104 output by the linear equalizer circuitry 110, information 171 on a transmit clock used for transmitting the optical signal. The clock recovery circuitry 170 may employ common clock recovery techniques for determining the information 171 on the transmit clock used for transmitting the optical signal over the PON. Further, the receiver 200 comprises clock generation circuitry 180 which is configured to generate a clock signal 181 for the ADC circuitry 110 based on the information 171 on the transmit clock. The clock generation circuitry 180 may be any circuitry suitable circuitry for generating a clock signal based on (e.g. digital) input information. For example, the clock generation circuitry 180 may be a Phase-Locked Loop (PLL), a Delay-Locked Loop (DLL) or a frequency synthesizer using Direct Digital Synthesis (DDS). The ADC circuitry 110 generates the digital receive signal 102 using the clock signal 181 as sampling clock.

In the example of FIG. 2, the secondary equalizer circuitry 130 comprises a Maximum Likelihood Sequence Estimation (MLSE) equalizer configured to determine a most likely binary transmit sequence 107 based on the equalized receive signal 104. The MLSE equalizer uses the Viterbi algorithm to equalize the equalized receive signal 104 through a dispersive channel in order to determine the most likely binary transmit sequence 107. The most likely binary transmit sequence 107 denotes the most likely representative of the binary transmit sequence encoded to the optical signal at the transmitter side for transmission over the PON to the receiver 200.

Further, the secondary equalizer circuitry 130 comprises an Inter-Symbol Interference (ISI) estimator 132 configured to determine an estimate for an ISI in the equalized receive signal 104 based on the determined most likely binary transmit sequence 107. The inter-symbol interference estimator 132 outputs a signal 108 indicating the estimate for the ISI. A combiner 133 of the secondary equalizer circuitry 130 is configured to combine (e.g. sum or add) the equalized receive signal 104 and the signal 108 indicating the estimate for the intersymbol interference to a modified receive signal 109.

The secondary equalizer circuitry 130 additionally comprises a soft information determination circuit 134 configured to determine the soft information 105 based on the modified receive signal 109. For example, the soft information determination circuit 134 may be configured to determine LLRs indicating the respective reliability of the elements in the equalized receive signal 104 as the soft information. However, it is to be noted that the soft information determination circuit 134 may alternatively determine any other type of soft information indicating the respective reliability of the elements in the equalized receive signal 104 (e.g. Euclidean distances).

Similar to what is described above for the receiver 100, the receiver 200 comprises the decoder circuitry 140 which receives the soft information 105 and generates the digital output signal 106 based on the soft information 105 using soft decision FEC. In the example of FIG. 2, the decoder circuitry 140 is implemented as LDPC decoder.

FIG. 3 illustrates an example of another receiver 300. The receiver 300 differs from the receiver 200 only with respect to the implementation of the secondary equalizer circuitry 130. Therefore, for the other components of the receiver 300, is it is referred to above description of the receiver 200.

While the secondary equalizer circuitry 130 in the receiver 200 uses the MLSE equalizer 131 and further circuits, the secondary equalizer circuitry 130 in the receiver 300 is implemented as a BCJR (Bahl, Cocke, Jelinek and Raviv) equalizer which is configured to receive the equalized receive signal 104 and determine the soft information 105 based on the equalized receive signal 104. The BCJR equalizer uses the BCJR algorithm for determining the soft information 105 based on the equalized receive signal 104. As indicated in FIG. 3, the soft information 105 may be LLRs $L_t$ indicating the respective reliability of the elements in the equalized receive signal 104. However, it is to be noted that the BCJR equalizer may alternatively determine any other type of soft information indicating the respective reliability of the elements in the receive sequence (e.g. Euclidean distances).

FIG. 4 illustrates an example of a receiver 400. The receiver 400 is an extension of the receiver 300 illustrated in FIG. 3. In contrast to the receiver 300, the decoder circuitry 140 in the receiver 400 is additionally configured to feedback the digital output signal 104 to the BCJR equalizer. In other words, the further soft information (e.g. LLRs) indicating the respective reliability of the elements in the receive sequence is fed back from the decoder circuitry 140 to the secondary equalizer circuitry 130 in the example of FIG. 4. The BCJR equalizer is configured to adjust a branch metric used for determining the soft information 105 based on the digital output signal 106 (i.e. the further soft information). Adjusting the branch metric used for determining the soft information 105 in the BCJR equalizer may allow to improve equalization at the BCJR equalizer.

Further details of the equalization processes in the various secondary equalizer circuitries of the examples illustrated in FIGS. 2 to 4 will be given in the following.

The receiver architectures of the proposed Viterbi-based receiver shown in FIGS. 2 to 4 use an (e.g. low resolution) ADC 110 followed by a linear FFE 120. Based on the FFE output signal $\hat{\chi}$, i.e. the equalized receive signal 104, clock recovery for the sampling clock is performed and the output samples are further processed by the MLSE equalizer (see FIG. 2) or the BCJR equalizer (see FIGS. 3 and 4).

The binary transmit sequence $u_t \in \{0,1\}$, which is encoded to the optical signal 101 transmitted over the PON, may, e.g. be modulated to a 2-PAM signal $\chi \in \{-1,1\}$ using Pulse-Amplitude Modulation (PAM) such that $\chi_t = \text{pam}_e(u_t)$. The transmission channel, which includes the electrical modulation and transmitter laser may be modeled as a discrete non-linear channel with $N_{ch}$ samples memory. The analog receive signal 102 at time instance t may be described as in the following mathematical expression (1):

$$y_t = h(x) + n(x_t)$$

with the component $h(\chi_t)$ denoting the mean of the analog receive signal $y_t$ for a given transmit signal vector $\chi_t = [x_t, \ldots, \chi_t - N_{ch} + 1]^T$ and $n(\chi_t)$ denoting the receive signal-dependent variance of the analog receive signal $y_t$.

Figure 5:
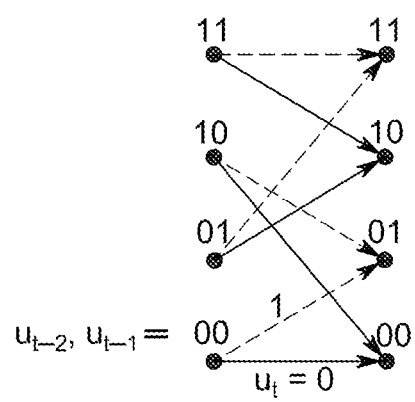
FIG. 5 illustrates an example of a Trellis-diagram.

The MLSE- and BCJR-equalizers in the examples of FIGS. 2 to 4 are based on a state transition model such as the Trellis diagram 500 illustrated in FIG. 5. FIG. 5 illustrates the Trellis diagram 500 for a $N_{MLSE}=3$ bit equalizer length. The state $s_t \in \{0, \ldots 2^{N_{mlse}-1}\}$ depends on $N_{mlse}-1$ consecutive bits of the bit sequence according to the following mathematical expression (2)

$$s_t = \sum_{i=0}^{N_{mlse}-2} u_{t-i} 2^i.$$

Each new transmitted bit $u_t$ allows certain transitions from state $s_{t-1}$ to $s_t$ according to the Trellis diagram. For example, if the transmitted bits $u_{t-2}$ and $u_{t-1}$ are both 0, the transmitted bit $u_t=0$ may be received as 0 or 1 such that the state $s_t$ may be 00 or 01 as illustrated in the lower part of the Trellis diagram 500. With the analog receive signal $y_t$ or the output of the linear equalizer $\hat{\chi}_{FFE,t}$ i.e. the equalized receive signal 104, the transition probabilities $p(s_{t-1}, s_t, \hat{\chi}_{FFE,t})$, may be evaluated. In this respect, $\hat{\chi}_{FFE,t} = [\hat{\chi}_{FFE,t} - N_{mlse}+1, \ldots, \hat{\chi}_{FFE,t}]^T$ is a sequence of FFE output samples, i.e. a sequence of samples/elements output by the linear equalizer circuitry 120.

The input to the decoder circuitry 140 (e.g. an LDPC decoder) is one reliability value (e.g. a LLR value) per bit $L_t$. For example, for a given vector $\hat{\chi}_{FFE,t}$ of the FFE output samples in the equalized receive signal 104, the LLR value may be defined as in the following mathematical expression (3):

$$L_t(u_t \mid \hat{x}_{FFE,t}) = \frac{P(u_t = 1 \mid \hat{x}_{FFE,t})}{P(u_t = 0 \mid \hat{x}_{FFE,t})}$$

where all transitions $s_{t-1} \to s_t$, where the bit $u_t$ is involved, are evaluated.

A non-linear channel model may be used by the secondary equalizer circuitry 130 irrespective of whether secondary equalizer circuitry 130 comprises a MLSE or a BCJR equalizer. For example, in the receiver 200, the ISI estimator 132 may be configured to determine the estimate for the ISI in the equalized receive signal 104 using a non-linear model of the transmit channel for the optical signal in the PON. Analogously, in the receivers 300 and 400, the BCJR equalizer may be configured to determine the soft information 105 using a non-linear model of the transmit channel for the optical signal in the PON.

A non-linear channel model is used inside the (e.g. MLSE or BCJR based) receivers according to the proposed architecture. For example, two look-up tables may be used for the nonlinear model of the transmit channel. The secondary equalizer circuitry 130 may, e.g., store the look up tables. The two look-up tables return the mean and variance of the signal $\chi_t$, given the transmit bit $u_t$ and the trellis state $s_{t-1}$. The mean value look-up table may be described as $h(s_{t-1}, u_t)$ and the variance look up table may be described as $\sigma^2(s_{t-1}, u_t)$. In other words, a first look-up table represents a mean estimate $h(s_{t-1}, u_t)$ of the transmit channel, and a second look-up table represents a variance $\sigma^2(s_{t-1}, u_t)$ of the mean estimate of the transmit channel.

The non-linear model of the transmit channel may be trained. For example, each of the receivers 100, 200, 300 or 400 may comprise respective calibration circuitry for training the non-linear model of the transmit channel as used by the secondary equalizer circuitry 130. The calibration circuitry is not illustrated in FIGS. 1 to 4 for reasons of simplicity.

During a training period, the optical receive signal may be encoded with a (predefined) binary training sequence that comprises all possible state transitions in a predefined Trellis diagram such as the Trellis diagram 500 illustrated in FIG. 5. Using the known binary training sequence may allow to increase an accuracy of the equalizer training. With respect to the Trellis diagram illustrated in FIG. 5, the binary training sequence may, e.g., be 0 0 0 1 1 1 0 0 1 0 0 indicating the state transitions 0 0 1 3 3 2 0 1 2 0.

For training the non-linear model of the transmit channel, the calibration circuitry is configured to determine a binary (hard decision) output sequence based on the soft information 105 determined by the secondary equalizer circuitry 130 during the training period. Further, the calibration circuitry is configured to adapt the non-linear model of the transmit channel based on the determined binary output sequence.

For adapting the non-linear model of the transmit channel, the calibration circuitry may, e.g., be configured to determine a most probable state in the Trellis diagram for an element of the determined binary output sequence. Further, the calibration circuitry may be configured to determine a most probable transmitted element based on the element of the determined binary output sequence, and adapt the non-linear model of the transmit channel based on the most probable state in the Trellis diagram and the most probable transmitted element.

For example, assuming that the soft information 105 determined by the secondary equalizer circuitry 130 is LLRs, a hard decision output signal can be derived from the LLR values for training the non-linear channel model as in the following mathematical expression (4):

$$\hat{u}_t = \begin{cases} 0 & \text{for } L_t \geq 0 \\ 1 & \text{for } L_t < 0 \end{cases}$$

Using a hard decision output from the LLR values $L_t$ as a reference, the most probable state $s_t^*$ according to $$s_t^* = \sum_{i=0}^{N_{mlse}-2} \hat{u}_{t-i} 2^i$$

and the most probable transmitted bit $\hat{u}_t$ may be derived and be used as reference data to do estimates of the mean estimate $h(s_{t-1}, u_t)$ of the transmit channel $h(s_{t-1}, u_t)$ and the variance $\sigma^2(s_{t-1}, u_t)$ of the mean estimate of the transmit channel $\sigma^2(s_{t-1}, u_t)$.

The linear equalizer circuitry 120 upstream of the (e.g. MLSE or BCJR based) secondary equalizer circuitry 130 may allow to improve performance and may allow for a shorter secondary (e.g. MLSE or BCJR) equalizer. In particular, a number of taps of the secondary equalizer circuitry 130 may be reduced due to the linear equalizer circuitry 120. Further, the clock recovery for the ADC circuitry 110 may be facilitated due to the linear equalizer circuitry 120.

For the channel estimation, the hard decision output bit $\hat{u}_t$ according to mathematical expression (4) and the corresponding state $s_t$ should be known. Based on the channel estimation $h(s_{t-1}^*, \hat{u}_t)$, the linear equalizer circuitry 120 may be trained to minimize the error between, e.g., the BCJR channel estimate and the receive signal according to the following mathematical expression (5)

$$g_{leq} = \arg\min_{g_{leq}} \Sigma |h(s_{t-1}^*, \hat{u}_t) - \hat{x}_t|^2.$$

In mathematical expression (5), $h(s_{t-1}^*, \hat{u}_t)$ denotes the estimate of the transmit channel for the optical signal in the PON which is assumed by the secondary equalizer circuitry 130. Further, $\hat{x}_t$ denotes an element in the digital receive signal 103. With that, the linear equalizer circuitry 120 may reduce ISI that is not tracked by the BCJR equalizer and does not limit the BCJR performance. During the linear equalizer update, the channel estimation look-up table $h(s_{t-1}^*, \hat{u}_t)$ is not updated.

In other words, a transfer function of the linear equalizer circuitry 120 may be trained to not cancel an ISI in the digital receive signal 103 which is assumed by the secondary equalizer circuitry 130. For example, the transfer function of the linear equalizer circuitry 120 may be given by the coefficient vector $g_{leq}$ which is proportional to the following mathematical expression (6):

$$\arg\min_{g_{leq}} \Sigma |h(s_{t-1}^*, \hat{u}_t) - \hat{x}_t|^2$$

In the MLSE based receiver 200, the most likely transition $s_{t-1} \to s_t$ is searched. At a time instance t, a new FFE output sample $\hat{x}_t$ is provided by the linear equalizer circuitry 120 (and output in the equalized receive signal 104). For all possible states $s_{t-1}$ and $u_t=\{0,1\}$, the distance $D_t(s_{t-1}, u_t)$ according to the following mathematical expression (7)

$$D_t(s_{t-1}, u_t) = |\hat{x}_t - h(s_{t-1}, u_t)|^2$$

is evaluated.

In each step, $2^{N_{mlse}-1}$ survivor paths $s_t = 0, \ldots, 2^{N_{mlse}-1}$ are kept. From two previous states $\{s_{t-1}: u_t + 2\mod(s_{t-1}, 2^{N_{mlse}-2}) = s_t\}$, the one with the smaller sum distance $$D_{sum} = \sum_{i=0}^{N_{mlse}-1} D_{t-1}(s_{t-1-i}, u_{t-i})$$

is kept. From the path with $s_{t-1}$ and $u_t$ giving the minimum $D_{sum}$, the hard decision output is derived according to the following mathematical expression (8)

$$\hat{u}_{t-N_{mlse}+1} = \left\lfloor \frac{s_{t-1}}{2^{N_{mlse}-2}} \right\rfloor.$$

Based on the hard decision output values $\hat{u}_t$ of the MLSE equalizer 131, the states $s_t$ are derived using mathematical expression (2). With that, the ISI is estimated and subtracted according to the following mathematical expression (9)

$$\tilde{\chi}_t = \hat{\chi}_{FFE,t} - h(s_{t-1}^*, \hat{u}_t) + \bar{\chi}_t$$

with $\bar{\chi}_t = \text{pam}_e(\hat{u}_t)$ denoting the electrical modulator output at the transmitter side for $\hat{u}_t$.

In the BCJR based receivers 300 and 400, the input to the decoder circuitry 140 (e.g. an LDPC decoder) is soft information 105 such as one LLR value per bit $L_t$. For a given receive signal vector $\hat{\chi}_{FFE,t}$ as output by the linear equalizer circuitry 110, the LLR value per bit $L_t$ may be defined according to the following mathematical expression (10)

$$L_t(u_t | \hat{x}_{FFE,t}) = \frac{P(u_t = 1 | \hat{x}_{FFE,t})}{P(u_t = 0 | \hat{x}_{FFE,t})} = \frac{\sum_{u_t=1} p(s_{t-1}, s_t, \hat{x}_{FFE,t})}{\sum_{u_t=0} p(s_{t-1}, s_t, \hat{x}_{FFE,t})}$$

where all transitions $s_{t-1} \to s_t$, where the bit $u_t$ is involved, are evaluated.

The BCJR algorithm may calculate the probability $p(s_{t-1}, \hat{\chi}_{FFE,t})$ according to the following mathematical expression (11)

$$\log p(s_{t-1}, s_t, \hat{x}_{FFE,t}) = \alpha(s_{t-1}) + \gamma(s_{t-1}, S_t) + \beta(s_t)$$

with the forward recursion $\alpha(s_t)$, the backward recursion $\beta(s_t)$ and the branch metric $\gamma(s_{t-1}, s_t)$. The forward recursion $\alpha(s_t)$ may be defined according to the following mathematical expression (12):

$$\alpha(s_t) = \log \sum_{s_{t-1}} \exp(\alpha(s_{t-1}) + \gamma(s_{t-1}, s_t))$$

The backward recursion $\beta(s_t)$ may be defined according to the following mathematical expression (13):

$$\beta(s_t) = \log \sum_{s_{t+1}} \exp(\beta(s_{t+1}) + \gamma(s_t, s_{t+1})).$$

The branch metric $\gamma(s_{t-1}, s_t)$ may be defined according to the following mathematical expression (14):

$$\gamma(s_{t-1}, s_t) = \log p(\hat{x}_{ffe,t}|u_t, s_{t-1}) + L_{a,t}$$

$L_{a,t}$ denotes a priori information available, e.g., from the decoder circuitry 140 when doing turbo decoding. For the PON channel, the state transition probability $p(\hat{x}_{ffe,t}|u_t, s_{t-1})$ may be derived from two look-up tables as described: one look-up table for the mean estimate $h(s_{t-1}, u_t)$ and another look-up table for the variance $\sigma^2(s_{t-1}, u_t)$ such that the branch metric may be defined according to the following mathematical expression (15):

$$\gamma(s_{t-1}, s_t) = -\frac{1}{2\sigma^2(s_{t-1}, u_t)} |\hat{x}_{ffe,t} - h(s_{t-1}, u_t)|^2 + L_{u,t}.$$

As described above with respect to FIG. 4, some additional improvement of the BCJR equalization may by achieved when performing Turbo equalization, which means that the output soft information 106 (e.g. LLR values) of the decoder circuitry 140 (e.g. an LDPC decoder) is fed back to the BCJR decoder by setting the $L_{a,t}$ values in the branch metric in the mathematical expression (14) to the soft information 106 output by the decoder circuitry 140. For example, if the decoder circuitry 140 is an LDPC decoder output LLR values for indicating the respective reliability of the elements in the receive sequence, the $L_{a,t}$ values in the branch metric in the mathematical expression (14) may be set to the final LLR values output by the LDPC decoder. In other words, the decoder circuitry 140 feeds back the digital output signal 106 to the BCJR equalizer, and the BCJR equalizer adjusts the branch metric used for determining the soft information 105 based on the fed back digital output signal 106.

The performance of the proposed receive architecture will be highlighted in the following with reference to FIGS. 6 to 9.

Figure 6:
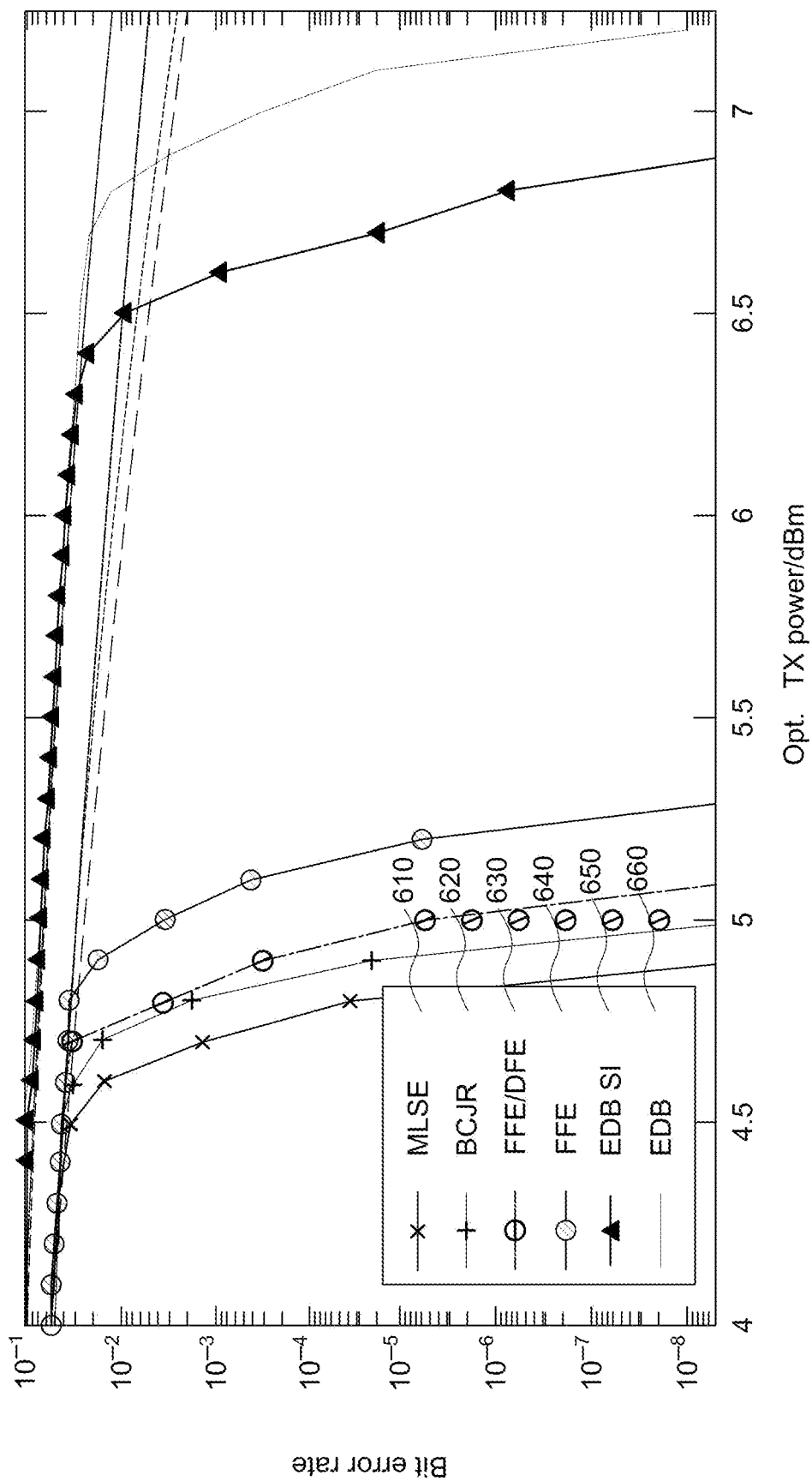
FIG. 6 illustrates an exemplary comparison of Bit Error Rate (BER) courses over transmit power for various equalization technologies.

FIG. 6 illustrates an exemplary comparison of BER courses over transmit power for various equalization technologies. In particular, line 610 illustrates the course of the output BER of an MLSE based receiver according to the proposed receive architecture (e.g. the receiver 200 illustrated in FIG. 2) and line 620 illustrates the course of the output BER of an BCJR based receiver according to the proposed receive architecture (e.g. one of the receivers 300 and 400 illustrated in FIGS. 3 and 4). As a reference, the lines 630, 640, 650 and 660 illustrate the courses of the output BER for conventional receivers based on one of a combination of a FFE and a Decision Feedback Equalizer (DFE), only a FFE, a Electrical DuoBinary (EDB) SI and EDB.

As can be seen from FIG. 6, the receivers according to the proposed receive architecture perform better than the conventional receivers. For example, the receivers according to the proposed receive architecture achieve the same coded error rates at a lower transmit power.

Figure 7:
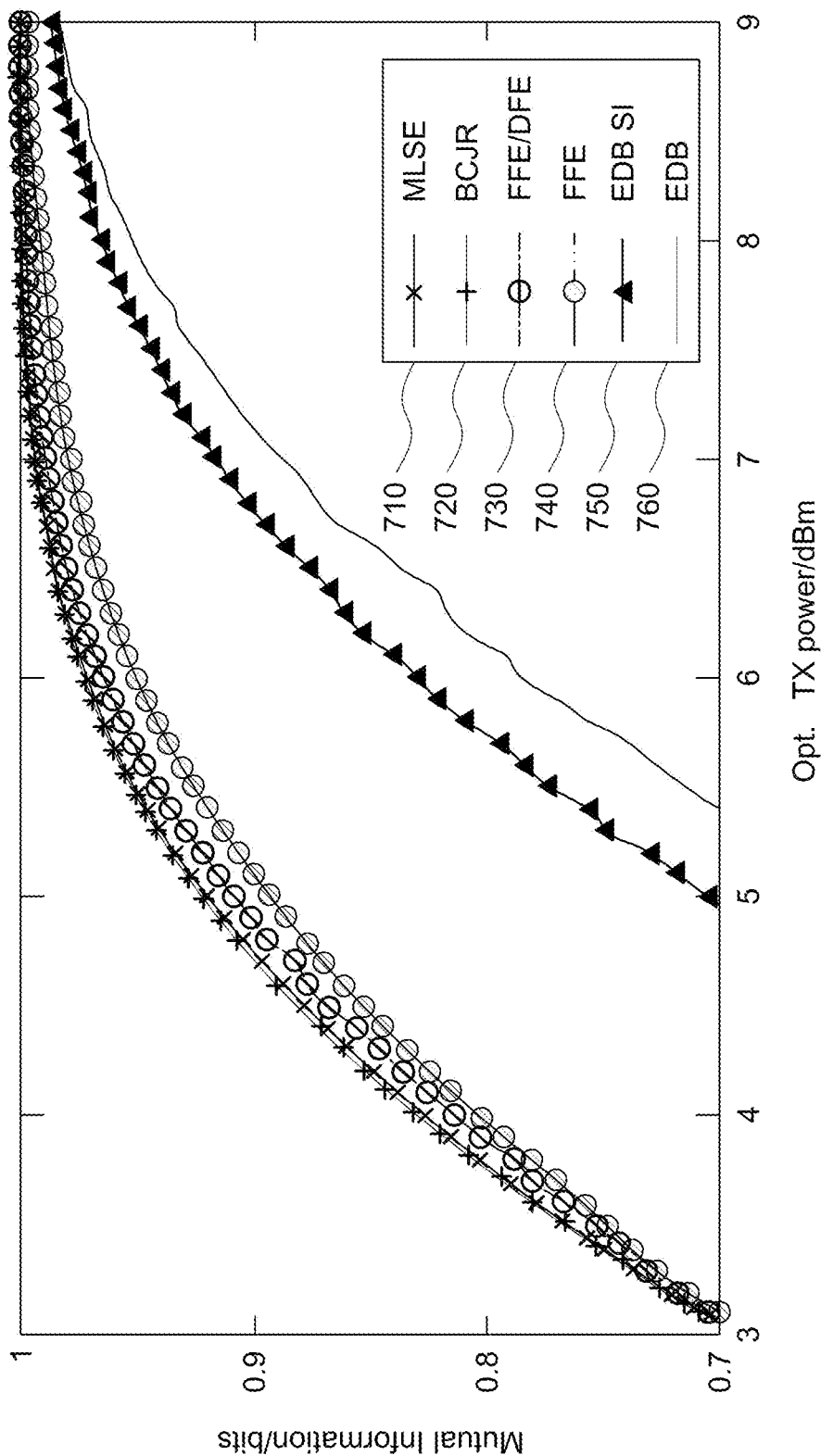
FIG. 7 illustrates an exemplary comparison of mutual information courses over transmit power for various equalization technologies.

FIG. 7 illustrates an exemplary comparison of mutual information courses over transmit power for various equalization technologies. In particular, line 710 illustrates the course of the mutual information of an MLSE based receiver according to the proposed receive architecture (e.g. the receiver 200 illustrated in FIG. 2) and line 720 illustrates the course of the mutual information of an BCJR based receiver according to the proposed receive architecture (e.g. one of the receivers 300 and 400 illustrated in FIGS. 3 and 4). As a reference, the lines 730, 740, 750 and 760 illustrate the courses of the mutual information for conventional receivers based on one of a combination of a FFE and a DFE, only an FFE, a EDB SI and EDB.

As can be seen from FIG. 7, the receivers according to the proposed receive architecture achieve for a given transmit power the highest mutual information of the soft information given to the decoder circuitry (e.g. LLR values given to a LDPC decoder).

Figure 8:
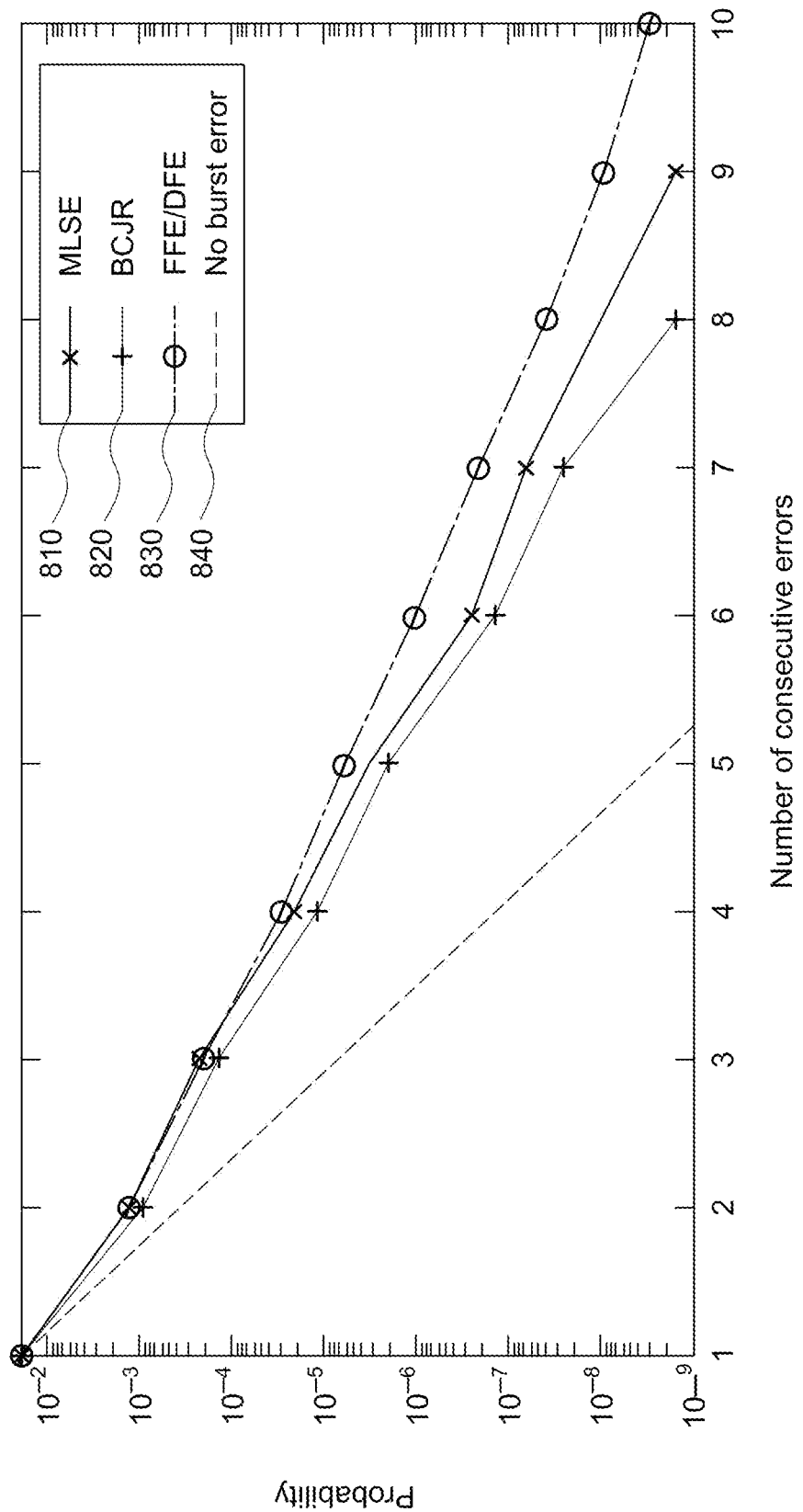
FIG. 8 illustrates an exemplary comparison of courses of the probability of consecutive out-put errors over the input number of consecutive errors for various equalization technologies.
Figure 9:
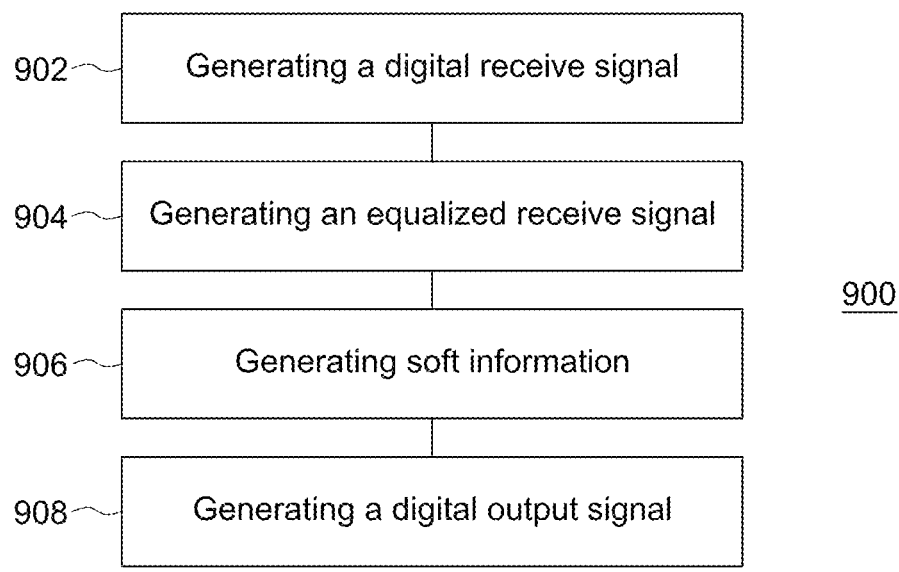
FIG. 9 illustrates a flowchart of an example of a method for a PON.

FIG. 8 illustrates an exemplary comparison of the probabilities of consecutive output errors over the input number of consecutive errors for various equalization technologies. In particular, line 810 illustrates the course of the probability of consecutive output errors of an MLSE based receiver according to the proposed receive architecture (e.g. the receiver 200 illustrated in FIG. 2) and line 820 illustrates the course of the probability of consecutive output errors of an BCJR based receiver according to the proposed receive architecture (e.g. one of the receivers 300 and 400 illustrated in FIGS. 3 and 4). As a reference, line 830 illustrates the probability of consecutive output errors of a receiver based on a combination of a FFE and a DFE. Further, line 840 illustrates the course of the hypothetical probability of consecutive output errors if no burst errors occurred.

In case error events are statistically independent, the probability of $P_{e,n}$ consecutive errors is $p_{e,1}{}^n$ wherein $p_{e,1}$ is the probability for one error. This is illustrated by line 840. Due to ISI, this is not achieved with any of the investigated receiver architectures. The receiver based on the combination of a FFE and a DFE shows a much higher probability of multiple consecutive errors. The receivers according to the proposed receive architecture achieve a significantly lower bust error probability. In other words, the issue of burst errors, as present for an FFE and DFE based receiver, is improved when using the proposed receive architecture.

The proposed architecture may allow implementation of an improved soft information receiver for a PON based on non-linear digital equalization.

Examples of the present disclosure may relate to a receiver architecture for PONs with an ADC and a soft decision FEC, which use a FFE followed by a Viterbi-based soft input soft output equalizer (e.g. a BCJR, soft output Viterbi equalizer). The FFE is trained such that the ISI used by the Viterbi-based equalizer is not canceled (e.g. using an equalizer that satisfies mathematical expression (5)). A receiver architecture for PONs with an ADC and a soft decision FEC is provided.

Other examples of the of the present disclosure may relate to a receiver architecture for PONs with an ADC and a soft decision FEC, where a FFE is followed by an MLSE equalizer. The ISI is estimated, based on the MLSE hard decision output (e.g. according to mathematical expression (9)). Further, soft information for a soft decision FEC is derived from the signal after subtracting the estimated interference.

Still other examples of the of the present disclosure may relate to a receiver architecture for PONs with an ADC and a soft decision FEC, where a FFE is followed by an BCJR equalizer. The output soft information from the LDPC code may be fed back to the BCJR decoder in case that the LDPC decoding failed (e.g. see FIG. 4).

Further examples of the of the present disclosure may relate to a receiver architecture for PONs with an ADC and a soft decision FEC, where a known training sequence designed to include all possible transitions of the Trellis diagram at least once.

For further illustrating the receive architecture described above, FIG. 9 illustrates a flowchart of a receive method 900 for a PON. The receive method 900 comprises generating 902 a digital receive signal based on an analog receive signal by ADC circuitry. The analog receive signal is based on an optical receive signal encoded with a binary transmit sequence. Additionally, the receive method 900 comprises generating 904 an equalized receive signal by linearly equalizing the digital receive signal by linear equalizer circuitry. The receive method 900 further comprises generating 906 soft information indicating a respective reliability of elements in the equalized receive signal by secondary equalizer circuitry using the Viterbi algorithm. In addition, the receive method 900 comprises generating 908 a digital output signal based on the soft information by decoder circuitry using soft decision FEC.

The receive method 900 may allow soft information reception from a PON with non-linear (digital) equalization.

More details and aspects of the method 900 are explained in connection with the proposed technique or one or more examples described above (e.g. FIGS. 1 to 4). The method 900 may comprise one or more additional optional features corresponding to one or more aspects of the proposed technique or one or more examples described above.

The examples described herein may be summarized as follows:

Example 1 is a receiver for a passive optical network, comprising: analog-to-digital converter circuitry configured generate a digital receive signal based on an analog receive signal, wherein the analog receive signal is based on an optical receive signal encoded with a binary transmit sequence; linear equalizer circuitry configured to generate an equalized receive signal by linearly equalizing the digital receive signal; secondary equalizer circuitry configured to generate soft information indicating a respective reliability of elements in the equalized receive signal using the Viterbi algorithm; and decoder circuitry configured to generate a digital output signal based on the soft information using soft decision forward error correction.

Example 2 is the receiver of example 1, wherein the linear equalizer circuitry comprises a feed-forward equalizer.

Example 3 is the receiver of example 2, wherein a transfer function of the linear equalizer circuitry is trained to not cancel an inter-symbol interference in the digital receive signal which is assumed by the secondary equalizer circuitry.

Example 4 is the receiver of example 2 or example 3, wherein a transfer function of the linear equalizer circuitry is given by a coefficient vector $g_{leq}$ which is proportional to:

$$\arg \min_{g_{leq}} \Sigma |h(s_{t-1}^*, \hat{u}_t) - \hat{x}_t|^2$$

with $h(s_{t-1}^*, \hat{u}_t)$ denoting an estimate of a transmit channel for the optical signal in the passive optical network which is assumed by the secondary equalizer circuitry and $\hat{x}_t$ denoting an element in the digital receive signal.

Example 5 is the receiver of any of examples 1 to 4, wherein the secondary equalizer circuitry comprises: a Maximum Likelihood Sequence Estimation, MLSE, equalizer configured to determine a most likely binary transmit sequence based on the equalized receive signal; an inter-symbol interference estimator configured to determine an estimate for an inter-symbol interference in the equalized receive signal based on the determined most likely binary transmit sequence; a combiner configured to combine the equalized receive signal and a signal indicating the estimate for the inter-symbol interference to a modified receive signal; and a soft information determination circuit configured to determine the soft information based on the modified receive signal.

Example 6 is the receiver of example 5, wherein the inter-symbol interference estimator is configured to determine the estimate for the inter-symbol interference in the equalized receive signal using a non-linear model of a transmit channel for the optical signal in the passive optical network.

Example 7 is the receiver of any of examples 1 to 4, wherein the secondary equalizer circuitry comprises a BCJR equalizer configured to receive the equalized receive signal and determine the soft information based on the equalized receive signal.

Example 8 is the receiver of example 7, wherein the BCJR equalizer is configured to determine the soft information using a non-linear model of a transmit channel for the optical signal in the passive optical network.

Example 9 is the receiver of example 7 or example 8, wherein the decoder circuitry is configured to feedback the digital output signal to the BCJR equalizer, and wherein the BCJR equalizer is configured to adjust a branch metric used for determining the soft information based on the digital output signal.

Example 10 is the receiver of any of examples 1 to 9, wherein the digital output signal indicates further soft information indicating a respective reliability of elements in a receive sequence determined by the decoder circuitry based on the soft information using forward error correction.

Example 11 is the receiver of example 10, wherein the further soft information is log likelihood ratios indicating the respective reliability of the elements in the receive sequence.

Example 12 is the receiver of any of examples 1 to 11, wherein the soft information is log likelihood ratios indicating the respective reliability of the elements in the equalized receive signal.

Example 13 is the receiver of any of examples 1 to 12, wherein the receiver further comprises calibration circuitry for training a non-linear model of a transmit channel for the optical signal in the passive optical network used by the secondary equalizer circuitry, wherein the optical receive signal is encoded with a binary training sequence during a training period that comprises all possible state transitions in a predefined Trellis diagram, and wherein the calibration circuitry is configured to: determine a binary output sequence based on the soft information determined by the secondary equalizer circuitry during the training period; and adapt the non-linear model of the transmit channel based on the determined binary output sequence.

Example 14 is the receiver of example 13, wherein, for adapting the non-linear model of the transmit channel, the calibration circuitry is configured to: determine a most probable state in the Trellis diagram for an element of the determined binary output sequence; determine a most probable transmitted element based on the element of the determined binary output sequence; and adapt the non-linear model of the transmit channel based on the most probable state in the Trellis diagram and the most probable transmitted element.

Example 15 is the receiver of example 13 or example 14, wherein the secondary equalizer circuitry is configured to store a first look-up table and a second look-up table representing the non-linear model of the transmit channel, wherein the first look-up table represents a mean estimate of the transmit channel, and wherein the second look-up table represents a variance of the mean estimate of the transmit channel.

Example 16 is the receiver of any of examples 1 to 15, wherein the decoder circuitry comprises a soft decision Low-Density Parity-Check, LDPC, decoder.

Example 17 is the receiver of any of examples 1 to 16, further comprising: clock recovery circuitry configured to determine, based on the equalized receive signal, information on a transmit clock used for transmitting the optical signal; and clock generation circuitry configured to generate a clock signal for the analog-to-digital converter circuitry based on the information on the transmit clock, wherein the analog-to-digital converter circuitry is configured generate the digital receive signal using the clock signal.

Example 18 is the receiver of example 17, wherein the clock generation circuitry is a phaselocked loop.

Example 19 is the receiver of any of examples 1 to 18, further comprising an interface for coupling to the passive optical network, wherein the interface is configured to receive the optical signal from the passive optical network.

Example 20 is the receiver of example 19, further comprising optical-to-electrical converter circuitry configured to convert the optical signal to the analog receive signal.

Example 21 is a receive method for a passive optical network, comprising: generating a digital receive signal based on an analog receive signal by analog-to-digital converter circuitry, wherein the analog receive signal is based on an optical receive signal encoded with a binary transmit sequence; generating an equalized receive signal by linearly equalizing the digital receive signal by linear equalizer circuitry; generating soft information indicating a respective reliability of elements in the equalized receive signal by secondary equalizer circuitry using the Viterbi algorithm; and generating a digital output signal based on the soft information by decoder circuitry using soft decision forward error correction.

Example 22 is the method of example 21, wherein generating the soft information comprises: determining a most likely binary transmit sequence based on the equalized receive signal by a Maximum Likelihood Sequence Estimation, MLSE, equalizer; determining an estimate for an inter-symbol interference in the equalized receive signal based on the determined most likely binary transmit sequence by an inter-symbol interference estimator; combining the equalized receive signal and a signal indicating the estimate for the inter-symbol interference in the binary receive sequence to a modified receive signal by a combiner; and determining the soft information based on the modified receive signal by a soft information determination circuit.

Example 23 is the method of example 21, wherein generating the soft information comprises: receiving the equalized receive signal at a BCJR equalizer; and determining the soft information based on the equalized receive signal by the BCJR equalizer.

Example 24 is the method of example 23, further comprising: feedbacking the digital output signal to the BCJR equalizer; and adjusting a branch metric used by the BCJR equalizer for determining the soft information based on the digital output signal.

Example 25 is the method of any of examples 21 to 24, wherein the optical receive signal is encoded with a binary training sequence during a training period that comprises all possible state transitions in a predefined Trellis diagram, and wherein the method further comprises: determining a binary output sequence based on the soft information determined by the secondary equalizer circuitry during the training period; and adapting, based on the determined binary output sequence, a non-linear model of a transmit channel for the optical signal in the passive optical network used by the secondary equalizer circuitry.

The aspects and features described in relation to a particular one of the previous examples may also be combined with one or more of the further examples to replace an identical or similar feature of that further example or to additionally introduce the features into the further example.

Examples may further be or relate to a (computer) program including a program code to execute one or more of the above methods when the program is executed on a computer, processor or other programmable hardware component. Thus, steps, operations or processes of different ones of the methods described above may also be executed by programmed computers, processors or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F)PLAs), (field) programmable gate arrays ((F)PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. A receiver for a passive optical network, comprising:
analog-to-digital converter circuitry configured generate a digital receive signal based on an analog receive signal, wherein the analog receive signal is based on an optical receive signal encoded with a binary transmit sequence;
linear equalizer circuitry configured to generate an equalized receive signal by linearly equalizing the digital receive signal;
secondary equalizer circuitry configured to generate soft information indicating a respective reliability of elements in the equalized receive signal using a Viterbi algorithm; and
decoder circuitry configured to generate a digital output signal based on the soft information using soft decision forward error correction.

2. The receiver of claim 1, wherein the linear equalizer circuitry comprises a feed-forward equalizer.

3. The receiver of claim 2, wherein a transfer function of the linear equalizer circuitry is trained to not cancel an inter-symbol interference in the digital receive signal which is assumed by the secondary equalizer circuitry.

4. The receiver of claim 2, wherein a transfer function of the linear equalizer circuitry is given by a coefficient vector $g_{leq}$ which is proportional to:

$$\arg\min_{g_{leq}} \Sigma |h(s^*_{t-1}, \hat{u}_t) - \hat{x}_t|^2$$

with $h(s^*_{t-1}, \hat{u}_t)$ denoting an estimate of a transmit channel for the optical signal in the passive optical network which is assumed by the secondary equalizer circuitry, wherein $s^*_{t-1}$ denotes a most probable trellis state and $\hat{u}_t$ denotes a most probable transmitted bit, and with $\hat{x}_t$ denoting an element in the digital receive signal.

5. The receiver of claim 1, wherein the secondary equalizer circuitry comprises:

a Maximum Likelihood Sequence Estimation, MLSE, equalizer configured to determine a most likely binary transmit sequence based on the equalized receive signal;
an inter-symbol interference estimator configured to determine an estimate for an inter-symbol interference in the equalized receive signal based on the determined most likely binary transmit sequence;
a combiner configured to combine the equalized receive signal and a signal indicating the estimate for the inter-symbol interference to a modified receive signal; and
a soft information determination circuit configured to determine the soft information based on the modified receive signal.

6. The receiver of claim 5, wherein the inter-symbol interference estimator is configured to determine the estimate for the inter-symbol interference in the equalized receive signal using a non-linear model of a transmit channel for the optical signal in the passive optical network.

7. The receiver of claim 1, wherein the secondary equalizer circuitry comprises a Bahl, Cocke, Jelinek, and Raviv (BCJR) equalizer configured to receive the equalized receive signal and determine the soft information based on the equalized receive signal.

8. The receiver of claim 7, wherein the BCJR equalizer is configured to determine the soft information using a non-linear model of a transmit channel for the optical signal in the passive optical network.

9. The receiver of claim 7, wherein the decoder circuitry is configured to feedback the digital output signal to the BCJR equalizer, and wherein the BCJR equalizer is configured to adjust a branch metric used for determining the soft information based on the digital output signal.

10. The receiver of claim 1, wherein the digital output signal indicates further soft information indicating a respective reliability of elements in a receive sequence determined by the decoder circuitry based on the soft information using forward error correction.

11. The receiver of claim 10, wherein the further soft information is log likelihood ratios indicating the respective reliability of the elements in the receive sequence.

12. The receiver of claim 1, wherein the soft information is log likelihood ratios indicating the respective reliability of the elements in the equalized receive signal.

13. The receiver of claim 1, wherein the receiver further comprises calibration circuitry for training a non-linear model of a transmit channel for the optical signal in the passive optical network used by the secondary equalizer circuitry, wherein the optical receive signal is encoded with a binary training sequence during a training period that comprises all possible state transitions in a predefined Trellis diagram, and wherein the calibration circuitry is configured to:
determine a binary output sequence based on the soft information determined by the secondary equalizer circuitry during the training period; and
adapt the non-linear model of the transmit channel based on the determined binary output sequence.

14. The receiver of claim 13, wherein, for adapting the non-linear model of the transmit channel, the calibration circuitry is configured to:
determine a most probable state in the Trellis diagram for an element of the determined binary output sequence;
determine a most probable transmitted element based on the element of the determined binary output sequence; and adapt the non-linear model of the transmit channel based on the most probable state in the Trellis diagram and the most probable transmitted element.

15. The receiver of claim 13, wherein the secondary equalizer circuitry is configured to store a first look-up table and a second look-up table representing the non-linear model of the transmit channel, wherein the first look-up table represents a mean estimate of the transmit channel, and wherein the second look-up table represents a variance of the mean estimate of the transmit channel.

16. The receiver of claim 1, wherein the decoder circuitry comprises a soft decision Low-Density Parity-Check, LDPC, decoder.

17. The receiver of claim 1, further comprising:
clock recovery circuitry configured to determine, based on the equalized receive signal, information on a transmit clock used for transmitting the optical signal; and
clock generation circuitry configured to generate a clock signal for the analog-to-digital converter circuitry based on the information on the transmit clock,
wherein the analog-to-digital converter circuitry is configured generate the digital receive signal using the clock signal.

18. The receiver of claim 17, wherein the clock generation circuitry is a phase-locked loop.

19. The receiver of claim 1, further comprising an interface for coupling to the passive optical network, wherein the interface is configured to receive the optical signal from the passive optical network.

20. The receiver of claim 19, further comprising optical-to-electrical converter circuitry configured to convert the optical signal to the analog receive signal.

21. A receive method for a passive optical network, comprising:
generating a digital receive signal based on an analog receive signal by analog-to-digital converter circuitry, wherein the analog receive signal is based on an optical receive signal encoded with a binary transmit sequence;
generating an equalized receive signal by linearly equalizing the digital receive signal by linear equalizer circuitry;
generating soft information indicating a respective reliability of elements in the equalized receive signal by secondary equalizer circuitry using a Viterbi algorithm; and
generating a digital output signal based on the soft information by decoder circuitry using soft decision forward error correction.

22. The method of claim 21, wherein generating the soft information comprises:
determining a most likely binary transmit sequence based on the equalized receive signal by a Maximum Likelihood Sequence Estimation, MLSE, equalizer;
determining an estimate for an inter-symbol interference in the equalized receive signal based on the determined most likely binary transmit sequence by an inter-symbol interference estimator;
combining the equalized receive signal and a signal indicating the estimate for the inter-symbol interference in the binary receive sequence to a modified receive signal by a combiner; and
determining the soft information based on the modified receive signal by a soft information determination circuit.

23. The method of claim 21, wherein generating the soft information comprises:
receiving the equalized receive signal at a Bahl, Cocke, Jelinek, and Raviv (BCJR equalizer; and
determining the soft information based on the equalized receive signal by the BCJR equalizer.

24. The method of claim 23, further comprising:
feedbacking the digital output signal to the BCJR equalizer; and
adjusting a branch metric used by the BCJR equalizer for determining the soft information based on the digital output signal.

25. The method of claim 21, wherein the optical receive signal is encoded with a binary training sequence during a training period that comprises all possible state transitions in a predefined Trellis diagram, and wherein the method further comprises:
determining a binary output sequence based on the soft information determined by the secondary equalizer circuitry during the training period; and
adapting, based on the determined binary output sequence, a non-linear model of a transmit channel for the optical signal in the passive optical network used by the secondary equalizer circuitry.

* * * * *